United States Patent
Xing et al.

(10) Patent No.: US 9,017,095 B2
(45) Date of Patent: Apr. 28, 2015

(54) FLEXIBLE FLAT CABLE ASSEMBLY HAVING A PROTECTING PORTION TO PROTECT GOLDEN FINGERS

(71) Applicant: Hon Hai Precision Industry Co., Ltd., New Taipei (TW)

(72) Inventors: Da-Wei Xing, Kunshan (CN); Jun Chen, Kunshan (CN); Jerry Wu, Irvine, CA (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/940,262

(22) Filed: Jul. 12, 2013

(65) Prior Publication Data
US 2014/0017935 A1 Jan. 16, 2014

(30) Foreign Application Priority Data
Jul. 12, 2012 (CN) ...................... 2012 2 0336408 U

(51) Int. Cl.
*H01R 12/59* (2011.01)
*H01B 7/08* (2006.01)
*H01R 12/77* (2011.01)
*H05K 1/11* (2006.01)

(52) U.S. Cl.
CPC .................. *H01R 12/59* (2013.01); *H01B 7/08* (2013.01); *H01R 12/771* (2013.01); *H05K 1/118* (2013.01); *H05K 1/117* (2013.01); *H05K 2201/2009* (2013.01)

(58) Field of Classification Search
CPC .. H01R 13/44; H01R 13/447; H01R 13/5213; H01R 13/6392
USPC .................................................. 439/499, 367
See application file for complete search history.

(56) References Cited

U.S. PATENT DOCUMENTS

| | | | | |
|---|---|---|---|---|
| 5,213,534 A * | 5/1993 | Gardner et al. | | 439/495 |
| 5,980,308 A * | 11/1999 | Hu et al. | | 439/497 |
| 6,743,045 B1 * | 6/2004 | Hayashi et al. | | 439/495 |
| 6,981,891 B1 * | 1/2006 | Huang | | 439/497 |
| 8,574,002 B2 * | 11/2013 | He et al. | | 439/495 |

FOREIGN PATENT DOCUMENTS

TW  I259619  5/2005

* cited by examiner

Primary Examiner — Chandrika Prasad
(74) Attorney, Agent, or Firm — Wei Te Chung; Ming Chieh Chang

(57) ABSTRACT

A flexible flat cable assembly comprises: a flexible flat cable having two opposite top and bottom surfaces, and defining a plurality of golden fingers exposed out of the top surface; and a base attached to the bottom surface of the flexible flat cable and defining a protecting portion formed on a front end thereof to shield front ends of the plurality of golden fingers.

10 Claims, 5 Drawing Sheets

FLEXIBLE FLAT CABLE ASSEMBLY HAVING A PROTECTING PORTION TO PROTECT GOLDEN FINGERS

FIELD OF THE INVENTION

The present invention relates generally to a flexible flat cable assembly, and more particularly to a flexible flat cable assembly for preventing front cross section of the golden fingers of a flexible flat cable from being oxidized.

DESCRIPTION OF PRIOR ART

A flexible flat cable (FFC) is a new data cable made by the high-tech automation equipments through laminating and extruding process. The flexible flat cable comprises a plurality of tinned flat copper wires and an insulative layer surrounding the plurality of tinned flat copper wires. The flexible flat cable is flexible, thin, small and further has some advantages of simple connection, convenient disassembly, solving the problem of the electromagnetic shielding easily and so on. And you can choose any number of copper wires of the flexible flat cable and a distance between two adjacent copper wires. Thus, the flexible flat cable is convenient to connect to a complementary connector. A volume of the electronic products can be designed to smaller and smaller due to the flexible flat cable. Obviously, the flexible flat cable also has a lower cost and with a high manufacturing efficiency. The flexible flat cable is widely used to connect two components, such as between a display device and a mainboard, and between two PCBs. The flexible flat cable is widely used in a miniaturization electrical devices for data transmission. A distance between two copper wires of the flexible flat cable can be designed to 0.5 mm, 0.8 mm, 1.0 mm, 1.25 mm, 1.27 mm, 1.5 mm, 2.0 mm, 2.54 mm and so on. The flexible flat cable is widely applied to a printer, a scanner, a copier, a camera, a car audio, a digital camera, a MP3, a DVD, a VCD, a monitor and other electronic products. T.W. Pat. No. 1259619 discloses a flexible flat cable module comprising a flexible flat cable and a base assembled with each other. The flexible flat cable defines a plurality of copper wires respectively with a golden finger for mating with a complementary connector. Each of golden finger has front cross section not shielded by the base. Thus, it is easily to be oxidized when the front cross section of the golden fingers are exposed to the air.

Hence, in this art, an improved flexible flat cable assembly to overcome the above-mentioned disadvantages of the prior art should be provided.

SUMMARY OF THE INVENTION

Accordingly, an object of the present invention is to provide a flexible flat cable assembly for effectively preventing front cross sections of the golden fingers of a flexible flat cable from being oxidized.

In order to achieve the above-mentioned objects, a flexible flat cable assembly comprises: a flexible flat cable having two opposite top and bottom surfaces, and defining a plurality of golden fingers exposed out of the top surface; and a base attached to the bottom surface of the flexible flat cable and defining a protecting portion formed on a front end thereof to shield front ends of the plurality of golden fingers.

Other objects, features and advantages of the invention will be apparent from the following detailed description taken in connection with the accompanying drawings.

DETAILED DESCRIPTION OF PREFERRED EMBODIMENTS

Figure 1:
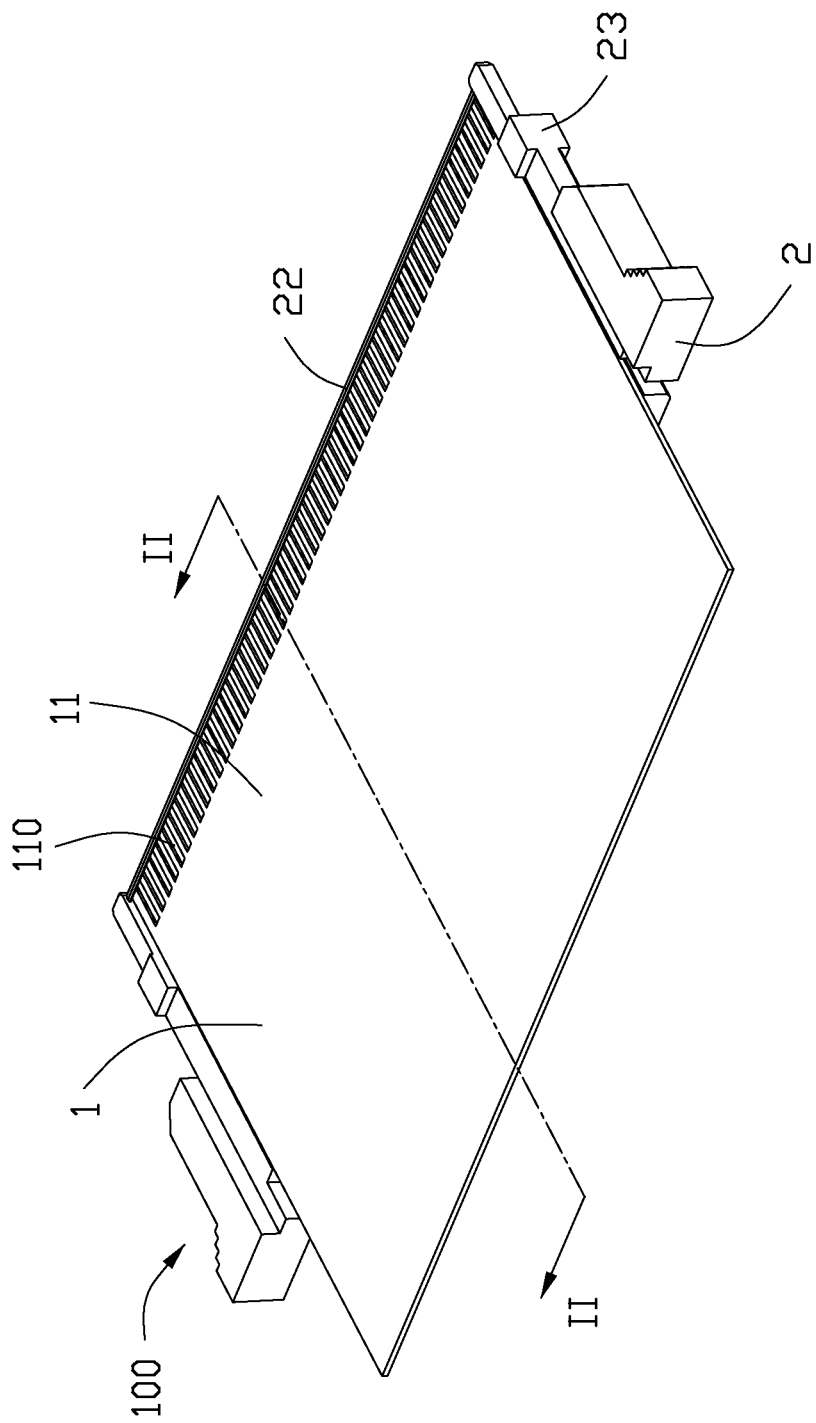
FIG. 1 is an assembled perspective view of a flexible flat cable assembly.

Reference will now be made to the drawing figures to describe the present invention in detail.

Figure 2:
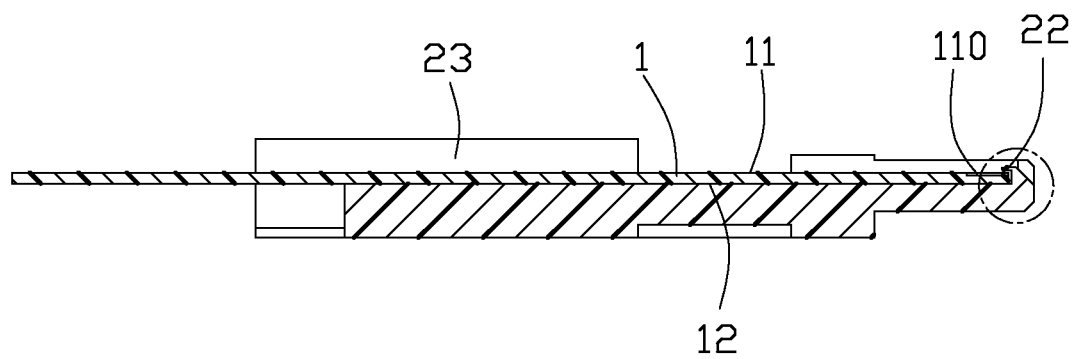
FIG. 2 is a cross-section view taken along line II-II of FIG. 1.
Figure 3:
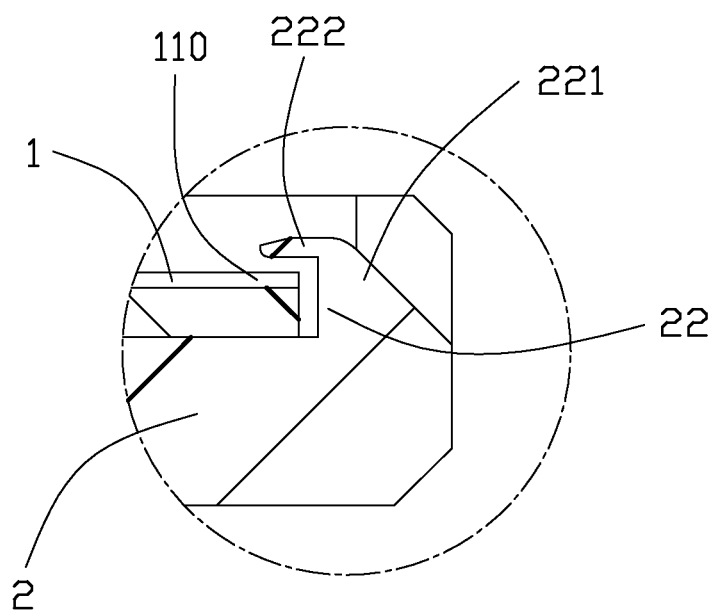
FIG. 3 is an enlarged view of a circle portion shown in FIG. 2 to clearly show a cross section of the golden fingers is closed in the circle portion.
Figure 4:
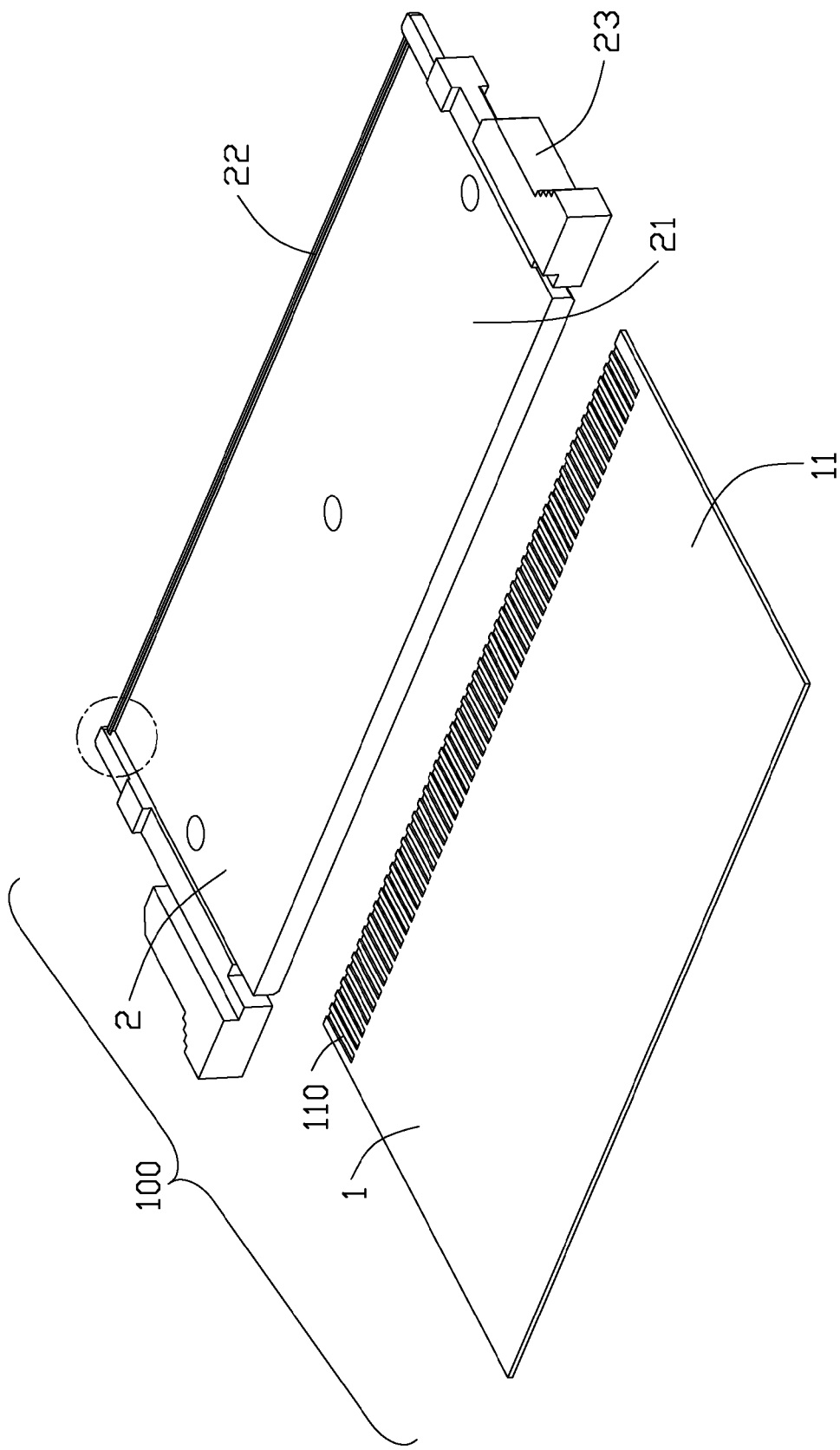
FIG. 4 is an exploded, perspective view of the flexible flat cable assembly of FIG. 1.
Figure 5:
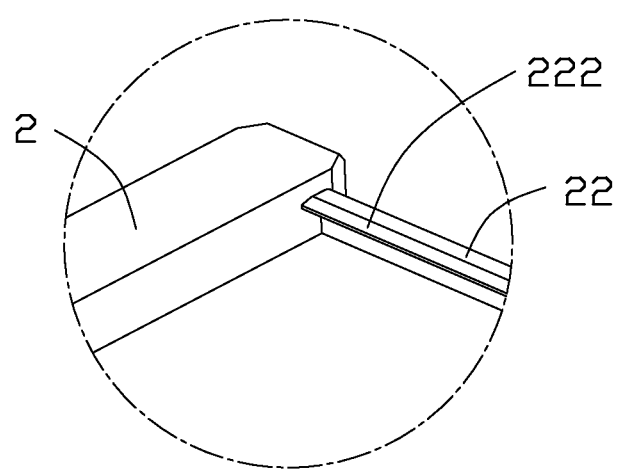
FIG. 5 is an enlarged view of a circle portion shown in FIG. 4.

FIGS. 1 to 5 illustrate perspective views of a flexible flat cable assembly 100 made in accordance with the present invention. The flexible flat cable assembly 100 comprises a flexible flat cable 1 defining a mating portion (not labeled) and a base 2 attaching to a bottom surface of the mating portion of the flexible flat cable 1. The flexible flat cable 1 defines a top surface 11 and a bottom surface 12 opposite to the top surface 11.

The flexible flat cable 1 defines an upper insulative layer, a lower insulative layer and a conductive wires layer sandwiched therebetween. The conductive wires layer comprises a plurality of conductors paralleled and spaced apart with each other. The mating portion of the flexible flat cable 1 defines a plurality of golden fingers 110 exposed out of a top surface 11 of the flexible flat cable 1 due to a plurality of insulative material are cutout from the upper insulative layer. The golden fingers 110 are formed on a front end of the conductive wires layer. The plurality of conductors are copper wires.

The base 2 comprises a body portion 21, a protecting portion 22 extending upwardly and backwardly from the body portion 21 and a pair of wing portions 23 extending laterally from the body portion 21. The protecting portion 22 defines a front wall 221 extending upwardly from the body portion 21 and a top wall 222 extending backwardly from the front wall 221.

The base 2 is attached to the bottom surface 12 of the flexible flat cable 1. A front end of the golden fingers 110 are shielded by the protecting portion 22 to prevent the cross section of the golden fingers 110 from too much contacting with air. Thus, the front ends of the golden fingers 100 will not be easily oxidized. And the flexible flat cable assembly 100 can be used for a long time.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A flexible flat cable assembly comprising:
   a flexible flat cable having opposite top and bottom surfaces, and defining a plurality of golden fingers exposed out of the top surface; and
   a base attached to the bottom surface of the flexible flat cable and defining a body portion, a protecting portion extending upwardly and backwardly from a front end of the body portion to shield front ends of the plurality of golden fingers;
   wherein front ends of the plurality of golden finger fingers are vertically shielded by the protecting portion.

2. The flexible flat cable assembly as recited in claim 1, wherein the base further comprises a pair of wing portions extending laterally from two sides of the body portion.

3. The flexible flat cable assembly as recited in claim 1, wherein the flexible flat cable defines a mating portion, the plurality of golden fingers are formed on a top surface of the mating portion.

4. The flexible flat cable assembly as recited in claim 1, wherein the flexible flat cable comprises an upper insulative layer, a lower insulative layer and a conductive-wire layer sandwiched therebetween, the plurality of golden fingers are formed on a front end of the conductive wires layer.

5. The flexible flat cable assembly as recited in claim 3, wherein the base is attached to the mating portion of the flexible flat cable.

6. A flexible cable connector assembly comprising:
   an insulative base including a planar body portion defining thereon a supporting face extending along both a front-to-back direction and a transverse direction perpendicular to each other;
   a protection portion extending along a front edge of said planar body in the transverse direction, said protection portion including a front wall upwardly extending from the front edge of the planar body, and a top wall rearwardly extending from the front wall and leaving a space between the top wall and the planar body portion in a vertical direction perpendicular to both said front-to-back direction and said transverse direction; and
   a flexible flat cable defining a plurality of gold fingers on a front edge region; wherein
   a front end region of each of said gold fingers are hidden under the top wall.

7. The flexible cable connector assembly as claimed in claim 6, wherein the top wall extends rearward from the front wall with a distance which is essentially similar to a thickness of the flexible flat cable.

8. The flexible cable connector assembly as claimed in claim 6, wherein the base further includes a pair of wing portions located on two opposite sides of the body portion.

9. The flexible cable connector assembly as claimed in claim 8, wherein a front portion of each of said wing portions are aligned with the gold fingers in the transverse direction, and a height of said front portion of each of said wing portions is higher than the top wall.

10. The flexible cable connector assembly as claimed in claim 8, wherein a front tip of the front portion of each of the wing portions is located in front of the front wall in the front-to-back direction.

\* \* \* \* \*